US009790584B2

(12) United States Patent
Gasworth

(10) Patent No.: US 9,790,584 B2
(45) Date of Patent: Oct. 17, 2017

(54) APPARATUS AND METHOD FOR DEPOSITING MULTIPLE COATING MATERIALS IN A COMMON PLASMA COATING ZONE

(75) Inventor: Steven M. Gasworth, Novi, MI (US)

(73) Assignee: SABIC GLOBAL TECHNOLOGIES B.V., Bergen Op Zoom (NL)

( * ) Notice: Subject to any disclaimer, the term of this patent is extended or adjusted under 35 U.S.C. 154(b) by 1558 days.

(21) Appl. No.: 12/123,274

(22) Filed: May 19, 2008

(65) Prior Publication Data
US 2008/0286492 A1 Nov. 20, 2008

Related U.S. Application Data

(60) Provisional application No. 60/938,559, filed on May 17, 2007.

(51) Int. Cl.
H05H 1/24 (2006.01)
C23C 16/00 (2006.01)
C23C 8/36 (2006.01)
C23C 16/513 (2006.01)
C23C 16/54 (2006.01)

(52) U.S. Cl.
CPC .............. C23C 8/36 (2013.01); C23C 16/513 (2013.01); C23C 16/54 (2013.01)

(58) Field of Classification Search
CPC ................. C23C 16/513; H01L 21/67751
USPC ............................................... 118/719, 723 R
See application file for complete search history.

(56) References Cited

U.S. PATENT DOCUMENTS

| 4,037,074 A | 7/1977 | Montbrun et al. |
| 4,957,061 A | 9/1990 | Ando et al. |
| 5,047,612 A | 9/1991 | Savkar et al. |
| 5,239,161 A | 8/1993 | Lang |
| 5,993,915 A | 11/1999 | Krebsbach |
| 6,259,072 B1 | 7/2001 | Kinnard et al. |
| 6,397,776 B1 | 6/2002 | Yang et al. |
| 6,947,802 B2 | 9/2005 | Picard et al. |

(Continued)

FOREIGN PATENT DOCUMENTS

| EP | 0 887 437 | 12/1998 |
| EP | 1006216 A2 | 6/2000 |

(Continued)

OTHER PUBLICATIONS

International Search Report and Written Opinion Corresponding to PCT/US2008/064137.

(Continued)

Primary Examiner — Parviz Hassanzadeh
Assistant Examiner — Nathan K Ford
(74) Attorney, Agent, or Firm — Cantor Colburn LLP

(57) ABSTRACT

An apparatus and method for coating a substrate moved along a path of travel through the apparatus. A plasma source issues a plasma jet into which a first reagent is injected from a discharge orifice located upstream of the jet. A second reagent is injected into the jet from a discharge orifice located downstream of the jet. A controller is configured to regulate the flow of the first reagent according to a first set of parameters and regulate the flow of the second reagent according to a second set of parameters. As a result, the first and second reagents are applied to the substrate to form at least one layer of a coating on the substrate.

16 Claims, 5 Drawing Sheets

(56) References Cited

U.S. PATENT DOCUMENTS

| | | |
|---|---|---|
| 6,948,448 B2 | 9/2005 | Schaepkens |
| 7,173,216 B2 | 2/2007 | Ptak |
| 7,521,653 B2 | 4/2009 | Gasworth |
| 2001/0022295 A1 | 9/2001 | Hwang |
| 2002/0187371 A1 | 12/2002 | Nakajima |
| 2003/0097988 A1* | 5/2003 | Schaepkens ........... 118/723 MP |
| 2003/0099784 A1 | 5/2003 | Schaepkens |
| 2004/0200417 A1 | 10/2004 | Hanawa et al. |
| 2005/0150454 A1* | 7/2005 | Li ......................... C23C 16/401 |
| | | 118/715 |
| 2005/0202184 A1* | 9/2005 | Iacovangelo et al. ........ 427/569 |
| 2006/0029746 A1* | 2/2006 | Gasworth ..................... 427/569 |
| 2006/0156983 A1 | 7/2006 | Penelon et al. |
| 2007/0215596 A1 | 9/2007 | Wintenberger et al. |
| 2008/0160205 A1 | 7/2008 | Gasworth |
| 2009/0181186 A1 | 7/2009 | Gasworth |

FOREIGN PATENT DOCUMENTS

| | | |
|---|---|---|
| WO | WO 96/32846 | 10/1996 |
| WO | 2004015348 A1 | 2/2004 |
| WO | 2004076716 A1 | 9/2004 |
| WO | 2005087977 A1 | 9/2005 |

OTHER PUBLICATIONS

"High-Rate Deposition of Abrasion Resistant Coatings Using a Dual-Source Expanding Thermal Plasma Reactor," by M. Schaepkens et al., General Electric Global Research Center, New York, J. Vac. Sci Technol. A 21(4), Jul./Aug. 2003, 6pp.

\* cited by examiner

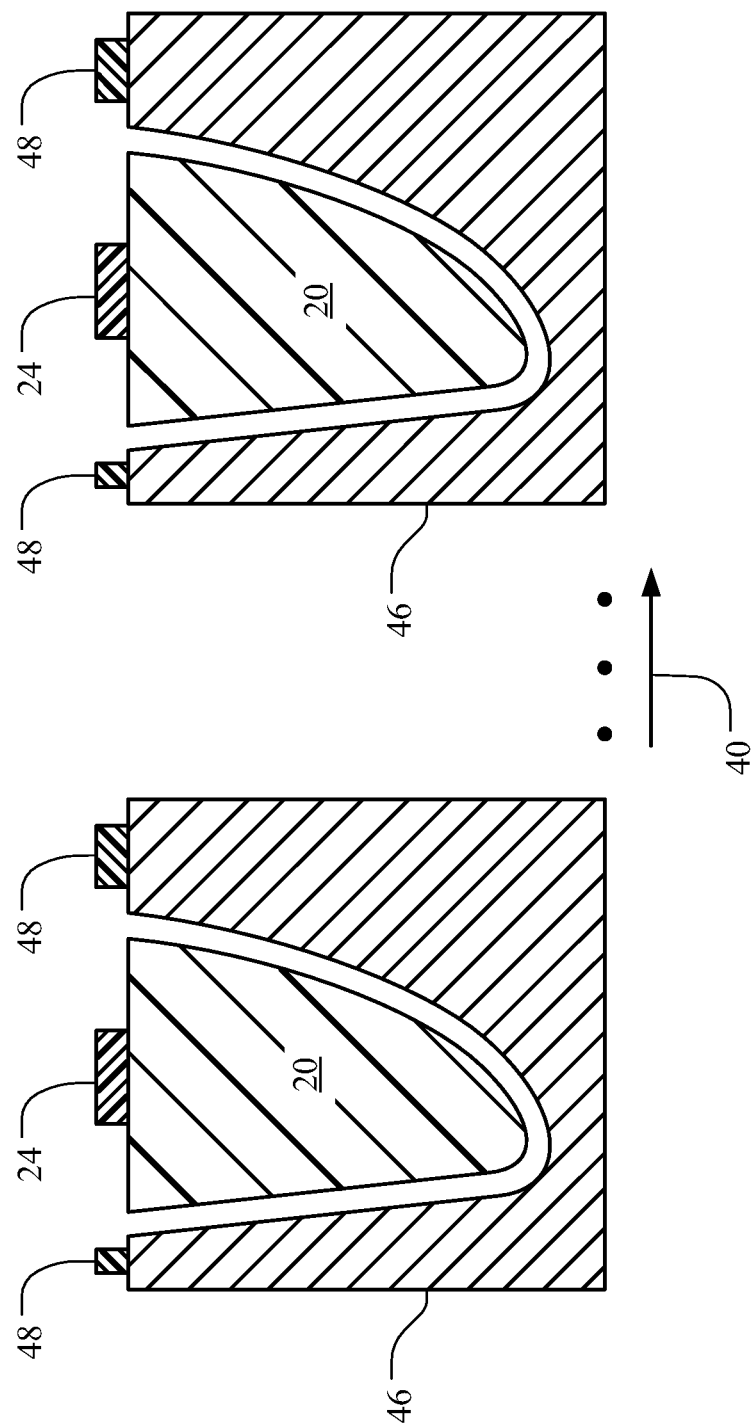

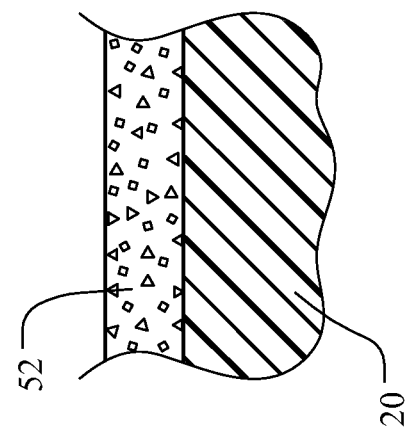
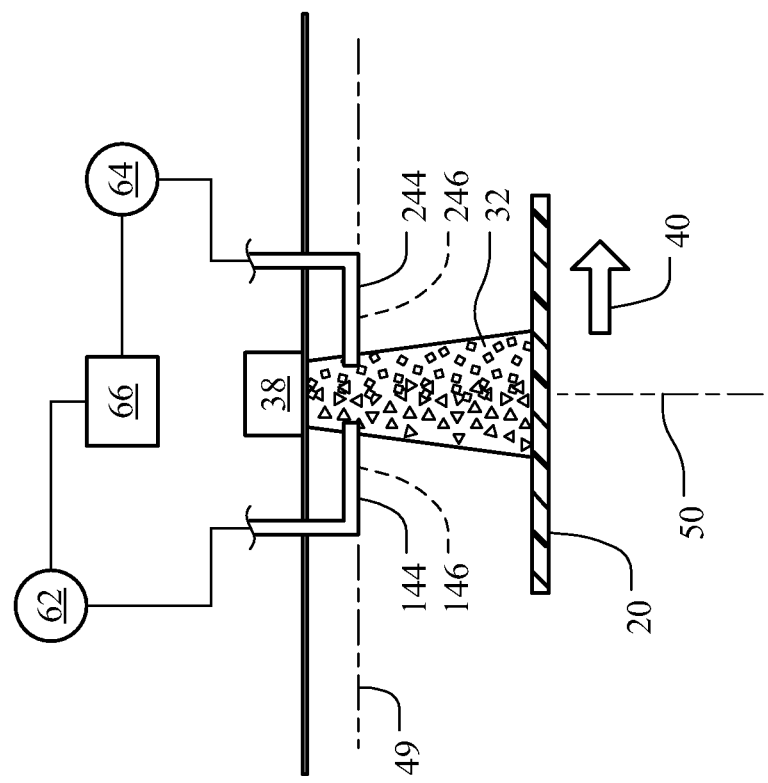

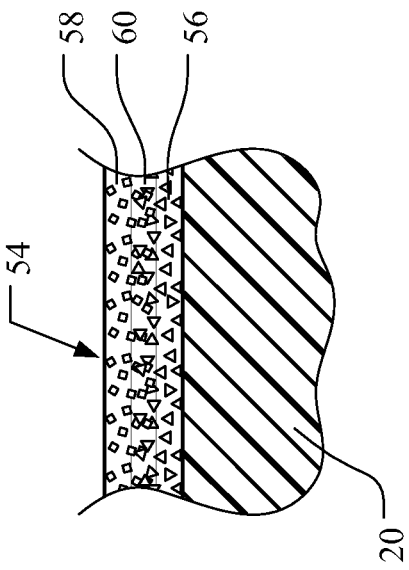
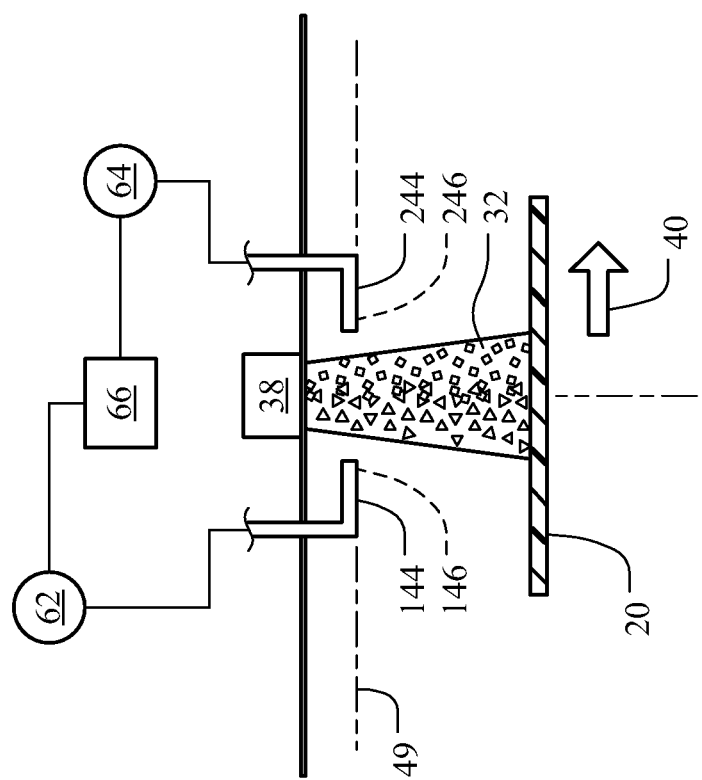
Fig. 6B
Fig. 6A

APPARATUS AND METHOD FOR DEPOSITING MULTIPLE COATING MATERIALS IN A COMMON PLASMA COATING ZONE

CROSS REFERENCE TO RELATED APPLICATION

This application claims the benefit of provisional application 60/938,559 filed May 17, 2007, the entire contents of which are herein incorporated by reference.

BACKGROUND

1. Field of the Invention

The present invention generally relates to a system for coating substrates. More specifically, the invention relates to a plasma coating system and method whereby the introduction of reagents is controlled to enhance the coating formed on the substrate.

2. Related Technology

Generally, plasma coating systems, to which the present invention is applicable, include various stations or zones connected in sequence and through which substrates are moved in a continuous series. These zones may include a load lock, a heating zone, one or more coating zones and an exit lock. In the coating zone(s) is one or more plasma sources, such as an expanding thermal plasma (ETP) source, and associated means for injecting coating reagents. During the coating process, the substrates are moved past the plasma source(s) as a coating reagent(s) is injected into a plasma jet issuing from the plasma source. As the substrates are moved through the resulting plasma plume, a coating is deposited on the surfaces of the substrates.

Such prior art systems do not allow for the simultaneous application of multiple coating sub-layers on to a single side of a substrate. If multiple coating sub-layers are to be applied, the once coated substrate is passed through additional coating zones, where the additional coating sub-layers are applied.

SUMMARY

Generally, the present invention is directed to an apparatus and method for simultaneous, dual-use of plasma sources by injecting different reagent compositions into each of the upstream and downstream sides of the plasma jet issuing from a respective plasma source. Alternatively, the reagent composition provided to both sides of the jet is the same, but the flow rates to the upstream and downstream sides are different. Different upstream and downstream reagent "recipes" can be reflected in the composite coating on the substrate, either as a blend of materials or as a gradation between two materials, depending on the injection parameters and time allowed for reagent penetration into the plasma jet before deposition onto the substrate.

Generally, an apparatus according to the present invention is an in-line, continuous plasma coating system for coating substrates. In such a system, a series of substrates is continuously passed through the coating zone in a sequential (single file) order. The plasma coating system may include one plasma source or an array of plasma sources (a plasma array). The system also includes means for injecting a first coating reagent into the plasma jet issuing from the plasma source from a location upstream of the plasma source, and a means for injecting a second coating reagent into the plasma jet from a location downstream of the plasma source.

The means for injecting the reagents may include manifolds, individual injectors or orifices, as are known in the art. A controller regulates the flow of the coating reagents during injection. A second set of means for injecting reagents may also be employed and controlled to deposit a coating on a second side or opposing surface of the substrate.

Further features and advantages will become readily apparent from the following description, and from the claims.

BRIEF DESCRIPTION OF THE DRAWINGS

FIG. 4 illustrates substrates with associated space-filling panels that may be optionally employed as the substrates are advanced through the system of FIG. 1;

FIG. 5A depicts a pair of injectors for coating a substrate in accordance with one embodiment of the present invention;

FIG. 5B depicts a blended coating on the substrate produced with the injectors shown in FIG. 5A;

FIG. 6A depicts a pair of injectors for coating a substrate in accordance with another embodiment of the invention;

FIG. 6B depicts a multilayer coating on the substrate produced with the injectors shown in FIG. 6A.

DETAILED DESCRIPTION

Figure 1:
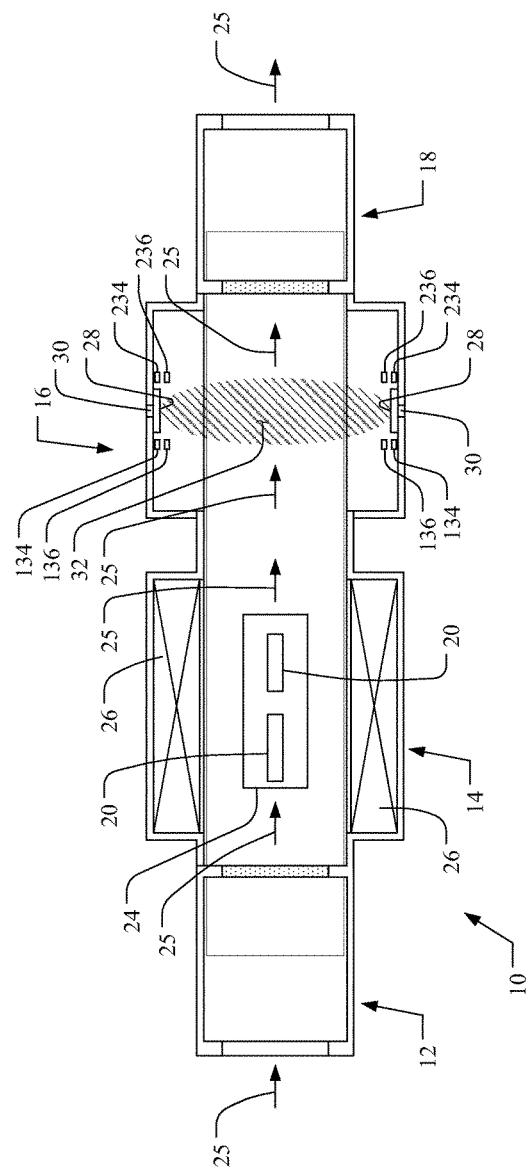
FIG. 1 is a schematic plan view of a system for coating substrates in accordance with the principles of the present invention.

Referring now to the drawings, a substrate coating system 10, in accordance with the principles of the present invention, is schematically shown in FIG. 1. The substrate coating system 10 is preferably used to coat a plurality of substrates 20 in forming a plastic glazing panel. One skilled-in-the-art will recognize that the resulting plastic glazing panel may be used in many applications that require optical transparency, including but not limited to, computer displays or monitors, displays for hand-held devices (e.g., cell phones, MP3 players, etc.), lenses, automotive components (including windows, sunroofs and headlamps), motorcycle windshields, helmet visors, and windows used in non-automotive applications, such as for boats, trains, planes, and buildings. The substrates 20 (two substrates being shown) are continuously moved through the system 10, which includes various stations or zones. Such zones may include a load lock 12, a substrate heating zone 14, one or more substrate coating zones 16 and an exit lock 18, all being connected in series and in an airtight manner. The various zones may be evacuated by one or more vacuum pumps (not shown) to maintain a suitable vacuum pressure that is conducive to the coating process.

As those skilled in the art will appreciate, the substrates themselves may be formed from a wide variety of materials. In an exemplary embodiment, the substrates 20 are made of a thermoplastic material. Such materials include, but are not limited to, polyvinylalcohol, polyvinylacetal, polyvinylacetate, polyethylene, polypropylene, polystyrene, polyamide, polyimide and polyvinylchloride. Other suitable materials for the substrates 20 include polycarbonate resins, polyestercarbonates, acrylic polymers, polyesters, polyurethanes, and the like. Further examples of materials from which the substrates 20 may be made include ceramic, glass, metal or a semiconductor. The substrates 20 may be formed by a variety of techniques, depending on the material of their construction. Such techniques include, without limitation, injection molding, cold forming, vacuum forming, extrusion, blow molding, transfer molding, compression molding, and thermal forming. Once formed, the substrates 20 may be curved or flat in shape and rigid or flexible in nature.

In utilizing the system 10, the substrates 20 are placed on a substrate carrier 24, which may be a rack, hanger or other device. Such devices are known in the industry and, therefore, are not further described herein. The substrate carrier 24 enters the load lock 12 and, in the load lock 12 or prior thereto, is engaged by a conveyor, generally indicated by arrows 25, that transports the carrier 24 and substrates 20 through the coating system 10. Obviously, any means suitable for transporting the carrier 24 and substrates 20 through the coating system 10 may be employed.

Once transferred into the substrate heating zone 14, the substrates 20 are heated to a temperature suitable for coating of the substrates 20. To achieve this, the substrate heating zone 14 includes heating units 26, two being shown. The heating units 26 are located within or outside of, at or along the side walls of, the substrate heating zone 14 or where dictated by the overall design of the system 10. Various types of heating units 26 may be employed and include, but are not limited to, infrared heaters, resistance heaters, non-reactive plasma jets and the like.

After traveling through the substrate heating zone 14, the substrate carrier 24 enters the substrate coating zone 16, where a coating is deposited on the substrates 20. Once the substrates 20 have been coated, they are then transferred to the exit lock 18, where they are released from the coating system 10.

While a variety of coating methodologies and procedures may be employed with the present invention, as illustrated, the substrate coating zone 16 includes one or more plasma arrays 28, such as an expanding thermal plasma (ETP) source array. The plasma arrays 28 may be arranged in pairs opposite one another in the coating zone 16. Each plasma source 38, as seen in FIG. 3, may be mounted on its own port or the plasma array 28 may be mounted to a manifold 30 located on the side walls of the substrate coating zone 16.

Each array 28 is preferably fed with an inert gas, which is heated, partially ionized and then issued from the array 28 as a series of plasma jets 32. This is generally illustrated in FIG. 1 as a composite plasma jet from opposed arrays 28, into the substrate coating zone 16. Examples of inert gases that may be utilized with the coating system 10 include, but are not limited to, argon, helium, neon and the like.

A first coating reagent and a second coating reagent, one of which may be an oxidizing gas, are injected from reagent injection manifold segments 34, 36, respectively. The coating reagents, injected in vapor form at a controlled rate, diffuse into the plasma jet 32, which expands into the substrate coating zone 16 and which is directed towards the substrates 20 being conveyed therethrough. Examples of coating reagents include, but are not limited to, organosilicons such as decamethylcyclopentasiloxane (D5), vinyltrimethylsilane (VTMS), dimethyldimethoxysilane (DMDMS), octamethylcyclotetrasiloxane (D4), tetramethyldisiloxane (TMDSO), tetramethyltetravinylcyclotetrasiloxane (V-D4), hexamethyldisiloxane (HMDSO) and the like. Examples of oxidizing gases include, but are not limited to, oxygen and nitrous oxide, or any combination thereof.

Figure 2:
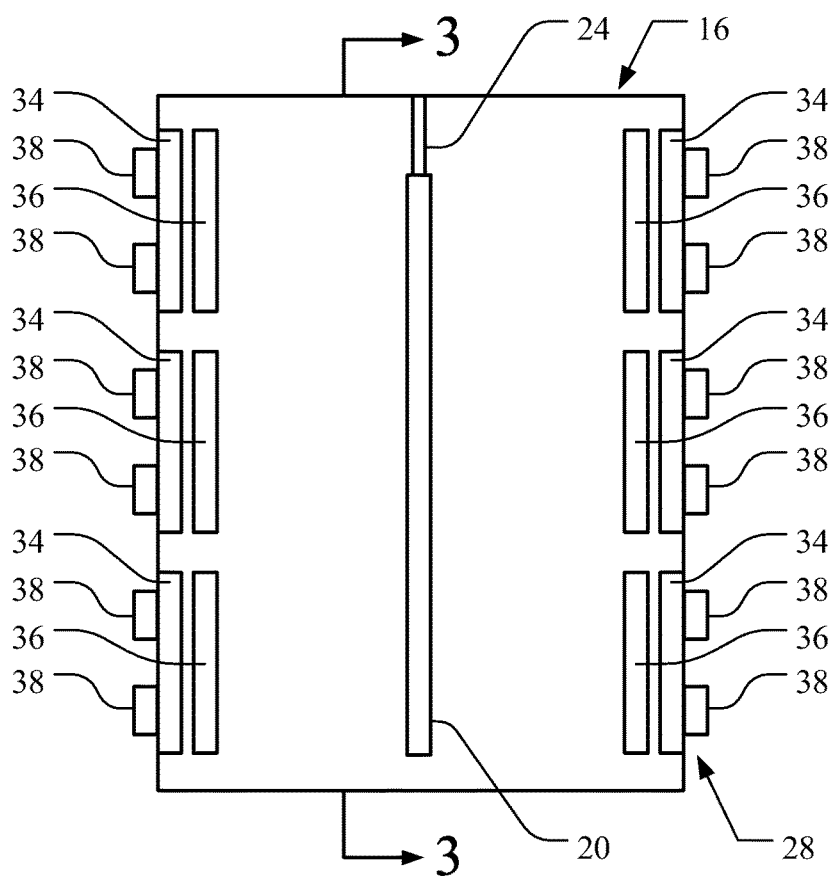
FIG. 2 is a schematic depiction of an end-view through the coating zone of the system of FIG. 1.
Figure 3:
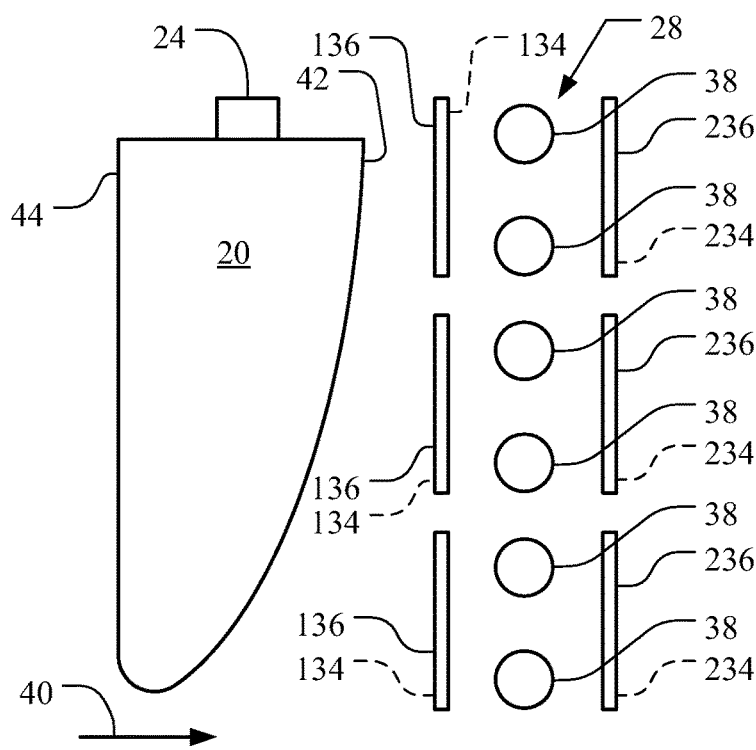
FIG. 3 is a schematic side-view of the coating zone seen in FIG. 2 and as generally taken along line 3-3.

Referring now to FIG. 2 and FIG. 3, various configurations of the system 10 involve depositing activated reagents, or, in some implementations a single reagent, on one or both sides of a substrate 20 as it advances through the coating zone 16. The substrate 20 is heated by the heating units 26 to ensure that the substrate 20 is at a suitable temperature before entering the coating zone 16. If needed additional heaters may be used in the coating zone 16 itself to make up for any heat loss during transit from the heating zone 14 to the coating zone 16.

The coating zone 16 is a vacuum chamber and includes one or more plasma sources 38 (six being illustrated as a non-limiting example), on one or both sides of the coating zone 16. The manifold segments 34, 36 may further be delineated as either an upstream manifold segment (134, 136) or a downstream manifold segment (234, 236) and each upstream segment 134, 136 is paired with a downstream segment 234, 236. As used herein, the terms upstream and downstream being referenced to the location of the manifold segment relative to the plasma sources 38 and the direction of movement (designated by the arrow 40 seen in FIG. 3) of the substrates 20. Each manifold segment 34, 36 is associated with one or more of the plasma sources 38. As such, one or both sides of the coating zone 16 illustrated in FIG. 3 is provided with upstream manifold segments 134, 136 and downstream manifold segments 234, 236. As shown in the illustrated embodiment, each side of the coating zone includes six upstream and six downstream manifold segments, although each side may include greater or fewer number of manifold segments. Segmenting the manifolds allows for individual flow switching according to a desired protocol. The various manifold segments 34, 36 of the coating zone 16 inject coating reagents therethrough independently of one another.

As shown in FIG. 3, the leading edge 42 of an advancing substrate 20 first passes the upstream manifold segments 134, 136, then the plasma array 28 and its individual plasma sources 38, and finally the downstream manifold segments 234, 236. Accordingly, the trailing edge 44 is the last portion of the substrate 20 to pass by the downstream manifold segments 234, 236.

When there are gaps or spaces between successive substrates 20 the system 10 may include features to minimize extraneous coating material being deposited on the vacuum chamber walls of the coating zone 16. In certain implementations, as seen in FIG. 4, this feature may be a space-filling panel 46, attached to the carrier 24 and/or conveyor 25 by a set of tabs 48, closely spaced to the substrate 20 such that it is a virtual extension of the edge of the substrate 20. Such a space-filling panel 46 is generally illustrated in FIG. 4.

In other implementations, shown in FIGS. 5A and 6A, rather than using manifold segments to coat the substrates 20, one or more upstream reagent injectors 144, 146 and one or more downstream reagent injectors 244, 246, may be associated with each plasma source 38 to deposit a coating on the substrate 20. Control of the flow of vaporized reagents to the various injectors is accomplished in the same manner as described above with respect to the various manifolds.

The above implementations are hereinafter described as being used to create a blended coating or graded coating on the substrate in a single coating zone 16. While any of the implementations may be used to produce these coatings, the description will only describe the processes in connection with FIGS. 5A and 6A, it being understood that manifold segments 134, 136, as seen in earlier figures, could alternatively be employed.

For convenience, two time characteristics are used to describe the coating process in relation to the plasma jet 32: a) lateral mixing time $l_t$ and b) transit time $t_t$. Lateral mixing time $l_r$ is characteristic of the length of time that a reagent requires to fully penetrate the plasma jet 32. Transit time $t_r$ is characteristic of the length of time it takes the plasma jet (with reagent(s)) to traverse the distance from the injector plane (the plane defined by the injectors 49), to the substrate 20, measured along the path of the plasma jet 32.

If blending of two functional coating materials (for example, one for UV blocking and one for abrasion resistance) is desired, then the reagents for the respective materials are each independently fed to the upstream and downstream injectors 144, 244, respectively. The parameters of the injectors 144, 244 (such as position, number, distribution, orientation, and size) and other process parameters are selected so as to promote rapid penetration of reagents towards the axis 50 of the plasma jet 32 of the respective plasma source 38, relative to the transit time of the jet 32 with reagents to the substrate. That is the parameters of the injectors 144, 244 and other process parameters are selected so that $l_r \ll t_r$. As the upstream reagent and downstream reagent are fed to the respective injectors 144, 244, the reagents blend within the plasma jet 32 to produce the blended coating 52 characterized by a substantially homogeneous layer reflecting the combined coating contributions of the upstream and downstream provided reagents. Depending on the specific reagents used, functionality of the individual coating materials may or may not be preserved when blended. Such a coating may be produced by the arrangement of the injectors 144, 244 shown in FIG. 5A, in which the tips of the injectors 144, 244 are inserted in the plasma jet 32 or near thereto.

If, on the other hand, a transition from one functional coating material to the other is desired, then reagents for the respective materials are again each independently fed to one of the upstream and downstream manifolds. However, the parameters of the injectors 144, 244 and other process parameters are selected to promote slow penetration of reagents into the plasma jet 32, relative to the transit time of the jet with reagents to the substrate; that is $l_r \gg t_r$. Coating sub-layers deposited by the upstream and downstream halves of the jet 32 will tend to reflect the respective reagents fed via the upstream and downstream injectors 144, 244. The resulting composite coating 54 on a substrate scanned or moved past the jet 32 will reflect a transition from the coating sub-layer formed by the upstream reagent to the coating sub-layer formed by the downstream reagent. Such a multilayer coating 54 may be produced by the arrangement of the injectors 144, 244 shown in FIG. 6A, in which the tips of the injectors are spaced from, and not inserted into, the plasma jet 32. That is, the parameters of the upstream and downstream injectors 144, 244 and other process parameters are selected to promote incomplete mixing and a separation of upstream reagent and downstream reagent within the plasma jet 32. The multilayer coating 54 (FIG. 6B) is characterized by two sub-layers 56, 58 and an intervening transition zone 60. The sub-layer 56 closest to and the sub-layer 58 furthest from the substrate 20 reflect, respectively, the dominance of the individual coating contributions of the upstream and downstream reagents.

The arrangement shown in FIG. 6A can be used to produce various types of multilayer coatings 54. In some implementations, the upstream and downstream injectors 144, 244 may share the same reagent sources, but the flow rates to the upstream and downstream injectors may be different. For example, one set of injectors may be supplied with D4 at one flow rate and the other set of injectors may be supplied with D4 at another flow rate. In other implementations, different reagents may be supplied to the upstream and downstream injectors 144, 244 from different sources 62, 64.

In a particular implementation, the transition between the first and second sub-layers 56, 58 of an abrasion-resistant coating can be such that significantly unbalanced thicknesses of the sub-layers result. For example, the thickness of the first sub-layer 56 may be reduced while the thickness of the second sub-layer 58 is increased, which improves abrasion-resistance without compromising water immersion performance, and without reducing throughput through the system 10.

In another implementation, the upstream injector 144 is employed to deposit an interface layer (IL) as the first sub-layer 56 to secure adhesion of the subsequent abrasion-resistant layer (the second sub-layer 58) to certain substrates 20 (for example, polycarbonate substrates). In one case, the IL is formed from the same organosilicon reagent used for the abrasion-resistant layer, but the oxidizing reagent flow associated therewith is relatively low or absent.

In another implementation, the upstream injector 144 is employed to deposit an IL first sub-layer 56, but the reagent differs from that used for the abrasion-resistant layer of the second sub-layer 58. In this case, separate sources (62, 64) are employed for the upstream and downstream injectors 144, 244.

In a further implementation, one of the injectors 144, 244 may be employed to deposit a UV blocking sub-layer (for example, $TiO_2$). In particular, the upstream and downstream injectors 144, 244 deposit an IL and a UV layer, respectively. An additional coating zone 16 can then be used to deposit an abrasion-resistant layer, as either one layer or two sub-layers. Alternatively, the upstream and downstream injectors 144, 244 in the first coating zone 16 deposit a UV layer as a first sub-layer 56 and an abrasion-resistant layer as a second sub-layer 58, and then a second coating zone 16 is used to complete deposition of the abrasion-resistant layer through further sub-layers.

In yet another implementation, the upstream injector 144 deposits a sub-layer of an abrasion-resistant layer, while the downstream injector 244 deposits a modified version of that sub-layer, tailored to provide a desired surface character, such as water-repelling or self-cleaning behavior, while preserving abrasion-resistance.

In any of the implementations, coatings may be produced as blends instead of as a gradation of sub-layers, with the use of the arrangement of the injectors 144, 244 shown in FIG. 5A. Additionally, more than one reagent may be supplied to each injector 144, 244. Another set of one or more injectors may be associated with each plasma source 38. These additional injectors may receive another reagent that is different from the reagents supplied to the injectors 144, 244. Alternatively, the additional injectors may receive a reagent that is the same as that supplied to one or both injectors 144, 244.

As seen in FIGS. 5A and 6A, the system 10 further includes a controller 66 that directs the upstream and downstream injectors 144, 244, such that the injectors can operate independently of one another. The sources 62, 64 provide the coating reagents in vapor form and, in doing so, may utilize pressurized coating reagent reservoirs and mass flow controllers. The controller 66 regulates the flow of the coating reagent to the individual injectors via the mass flow controllers.

As a person skilled in the art will readily appreciate, the above description is meant as an illustration of implementation of the principles of this invention. This description is not intended to limit the scope or application of this invention in that the invention is susceptible to modification, variation and change, without departing from spirit of this invention, as defined in the following claims.

What is claimed is:

1. An apparatus for coating a substrate moved along a path of travel through the apparatus, the apparatus comprising:
   a plasma source configured to issue a plasma jet toward the substrate as the substrate is moved along the path;
   a first reagent source containing a first reagent;
   an upstream discharge orifice located upstream of the plasma source relative to the path of travel of the substrate, the first reagent source being coupled to the upstream discharge orifice, the upstream discharge orifice being located to inject, in a direction perpendicular to the direction of the plasma jet, the first reagent from the first reagent source into the plasma jet issuing from the plasma source;
   a second reagent source containing a second reagent, the second reagent being different from the first reagent;
   a downstream discharge orifice located downstream of the plasma source relative to the path of travel of the substrate, the second reagent source being coupled to the downstream discharge orifice, the downstream discharge orifice being located to inject, in a direction perpendicular to the direction of the plasma jet, the second reagent from the second reagent source into the plasma jet issuing from the plasma source;
   a third source, wherein the third source is different than the second reagent source and the first reagent source, and wherein the third source comprises an oxidizing gas; and
   a controller configured to regulate the flow of the first reagent to the upstream discharge orifice according to a first set of parameters so that the first reagent is only injected upstream of the plasma source, the controller being configured to regulate the flow of the second reagent to the downstream discharge orifice according to a second set of parameters so that the second reagent is only injected downstream of the plasma source, such that the first and second reagents are applied to the substrate to form a layer of a coating on the substrate.

2. The apparatus of claim 1 wherein the first and the second reagents mix in the plasma jet to form a blended coating on the substrate.

3. The apparatus of claim 1 wherein the first and second reagents are applied to the substrate to form at least two sub-layers of the coating, each of the sub-layers being associated with the contribution from one of the upstream and downstream reagent sources.

4. The apparatus of claim 1 wherein the upstream discharge orifice and the downstream discharge orifice are respectively associated with an upstream manifold and a downstream manifold.

5. The apparatus of claim 4 wherein the upstream manifold and the downstream manifold respectively include a plurality of upstream and downstream orifices.

6. The apparatus of claim 1 wherein the upstream discharge orifice and the downstream discharge orifice are respectively associated with an upstream injector and a downstream injector.

7. The apparatus of claim 1 wherein the plasma source is one of a plurality of plasma sources of a plasma array and wherein the apparatus includes a plurality of upstream and downstream orifices, an upstream discharge orifice and a downstream discharge orifice being associated with each of the plasma sources of the plasma array, respectively.

8. The apparatus of claim 1 wherein at least one of the upstream and downstream discharge orifices is located within a region that includes the plasma jet of the plasma source.

9. The apparatus of claim 1 wherein at least one of the upstream and downstream discharge orifices is located outside of a region that includes the plasma jet of the plasma source.

10. The apparatus of claim 1, wherein the first reagent source is not coupled to the downstream discharge orifice and the second reagent source is not coupled to the upstream discharge orifice.

11. The apparatus of claim 1 wherein the upstream discharge orifice and the downstream discharge orifice are oriented to inject the first reagent source and the second reagent source into the plasma jet.

12. The apparatus of claim 1 wherein the apparatus is capable of coating two sides of a substrate.

13. An apparatus for coating a substrate moved along a path of travel through the apparatus, the apparatus comprising:
   a plasma source configured to issue a plasma jet toward the substrate as the substrate is moved along the path;
   a first reagent source containing a first reagent;
   an upstream discharge orifice located upstream of the plasma source relative to the path of travel of the substrate, the first reagent source being coupled to the upstream discharge orifice, the upstream discharge orifice being located to inject, in a direction perpendicular to the direction of the plasma jet, the first reagent from the first reagent source into the plasma jet issuing from the plasma source;
   a second reagent source containing a second reagent, the second reagent being different from the first reagent;
   a third source, wherein the third source is different than the second reagent source and the first reagent source, and wherein the third source comprises an oxidizing gas;
   a downstream discharge orifice located downstream of the plasma source relative to the path of travel of the substrate, the second reagent source being coupled to the downstream discharge orifice, the downstream discharge orifice being located to inject, in a direction perpendicular to the direction of the plasma jet, the second reagent from the second reagent source into the plasma jet issuing from the plasma source; and
   a controller configured to regulate the flow of the first reagent to the upstream discharge orifice according to a first set of parameters so that the first reagent is only injected upstream of the plasma source, the controller being configured to regulate the flow of the second reagent to the downstream discharge orifice according to a second set of parameters so that the second reagent is only injected downstream of the plasma source, such that the first and second reagents are applied to the substrate to form a layer of a coating on the substrate; and configured to regulate the flow of the first reagent and the second reagent to form coating layers on a substrate having different compositions.

14. The apparatus of claim 13, wherein the different coating compositions are selected from the first reagent, the second reagent, and blends of the first reagent and the second reagent.

15. The apparatus of claim 13, wherein the controller is configured to regulate the flow to form a layer of only the first composition and to form a layer of only the second composition.

16. The apparatus of claim 11 wherein the apparatus is capable of coating two sides of a substrate.

* * * * *